(12) United States Patent
Chen et al.

(10) Patent No.: US 9,646,941 B2
(45) Date of Patent: May 9, 2017

(54) SEMICONDUCTOR PACKAGING DEVICE INCLUDING VIA-IN PAD (VIP) AND MANUFACTURING METHOD THEREOF

(71) Applicant: TAIWAN SEMICONDUCTOR MANUFACTURING COMPANY LTD., Hsinchu (TW)

(72) Inventors: Ying-Ju Chen, Yunlin County (TW); Hsien-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 71 days.

(21) Appl. No.: 14/077,019

(22) Filed: Nov. 11, 2013

(65) Prior Publication Data

US 2015/0130049 A1    May 14, 2015

(51) Int. Cl.
*H01L 23/49* (2006.01)
*H01L 23/00* (2006.01)
(Continued)

(52) U.S. Cl.
CPC ............ *H01L 24/05* (2013.01); *H01L 23/528* (2013.01); *H01L 23/5226* (2013.01); *H01L 24/06* (2013.01); *H01L 24/03* (2013.01); *H01L 24/13* (2013.01); *H01L 2224/0345* (2013.01); *H01L 2224/03462* (2013.01); *H01L 2224/0401* (2013.01); *H01L 2224/05008* (2013.01); *H01L 2224/05088* (2013.01); *H01L 2224/05092* (2013.01); *H01L 2224/05569* (2013.01); *H01L 2224/05571* (2013.01); *H01L 2224/05572* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01);
(Continued)

(58) Field of Classification Search
CPC ... H01L 23/49811; H01L 24/03; H01L 24/13; H01L 23/49827; H01L 24/05; H01L 2224/039; H01L 2224/0401
USPC .......................................... 257/737; 438/613
See application file for complete search history.

(56) References Cited

U.S. PATENT DOCUMENTS

2012/0018876 A1* 1/2012 Wu et al. ................... 257/737
2012/0025369 A1* 2/2012 Kao ..................... H01L 21/563
                                                          257/737
(Continued)

*Primary Examiner* — John C Ingham
*Assistant Examiner* — Didarul Mazumder
(74) *Attorney, Agent, or Firm* — WPAT, P.C., Intellectual Property Attorneys; Anthony King

(57) ABSTRACT

A semiconductor device includes a carrier and a metallic structure including a metallic member, a pad and a via portion; wherein the metallic member is disposed inside the carrier, the pad is configured for receiving a solder bump and is disposed on a surface of the carrier, the via portion is configured for electrically connecting the metallic member and the pad, and the via portion is disposed proximal to an end of the pad. Further, a method of manufacturing a semiconductor device includes providing a carrier, removing a portion of the carrier for forming a via extending a surface of the carrier to an interior of the carrier, filling the via by a conductive material, and disposing the conductive material on the surface of the carrier, wherein the via is disposed proximal to an end portion of the conductive material.

20 Claims, 17 Drawing Sheets

(51) Int. Cl.
*H01L 23/522* (2006.01)
*H01L 23/528* (2006.01)

(52) U.S. Cl.
CPC .............. *H01L 2224/05684* (2013.01); *H01L 2224/0613* (2013.01); *H01L 2224/131* (2013.01); *H01L 2224/14131* (2013.01); *H01L 2224/16111* (2013.01); *H01L 2224/16145* (2013.01); *H01L 2224/81191* (2013.01); *H01L 2224/81801* (2013.01)

(56) References Cited

U.S. PATENT DOCUMENTS

| | | | | |
|---|---|---|---|---|
| 2012/0098123 | A1* | 4/2012 | Yu et al. ........................ | 257/737 |
| 2012/0326303 | A1* | 12/2012 | Lee et al. ...................... | 257/737 |
| 2013/0147052 | A1* | 6/2013 | Zhang et al. ................. | 257/774 |
| 2013/0270698 | A1* | 10/2013 | Chen ....................... | H01L 24/06 |
| | | | | 257/738 |

* cited by examiner

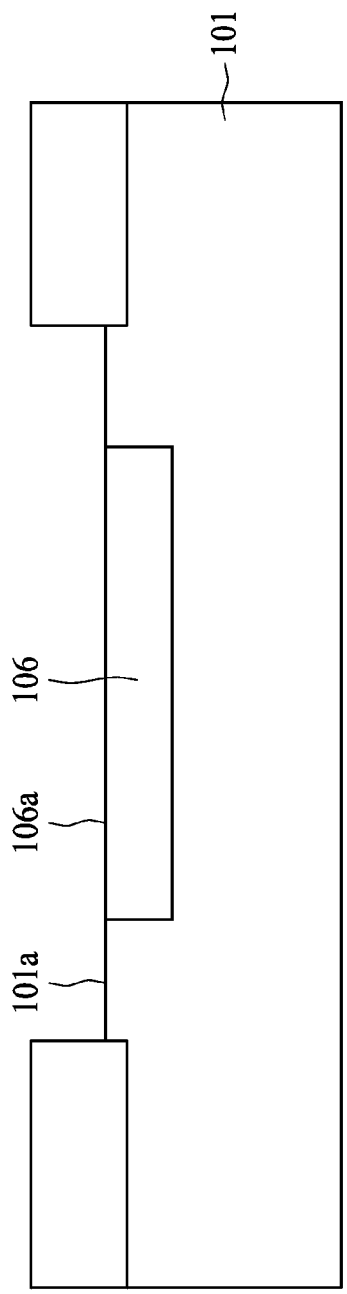
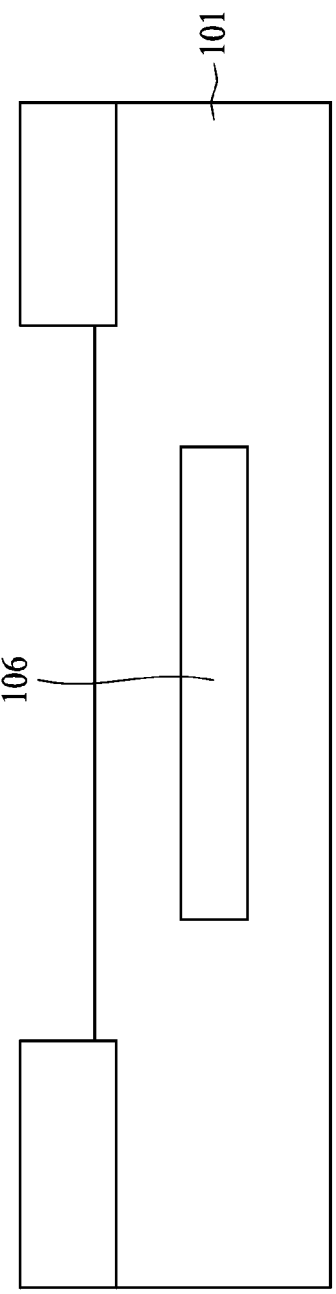

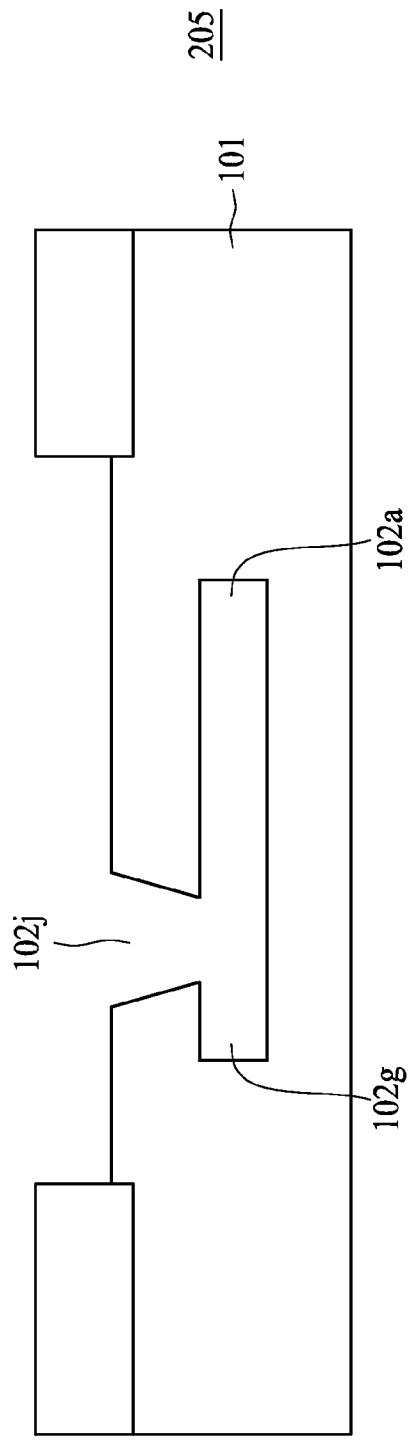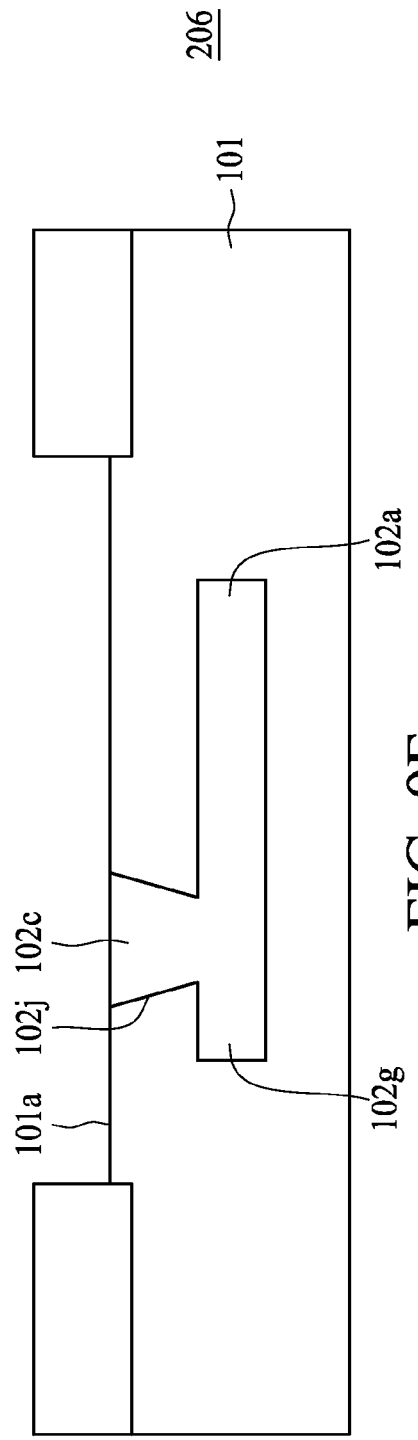

SEMICONDUCTOR PACKAGING DEVICE INCLUDING VIA-IN PAD (VIP) AND MANUFACTURING METHOD THEREOF

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments and thus the semiconductor devices inside the electronic equipments are getting smaller and smaller in size, while increasing in functionality. The ever decreasing in size of the semiconductor devices and the ever increasing in functionality have to accomplish a signal routing in a small area of the semiconductor devices.

A fan in wafer level packaging (WLP) technology have been gaining in popularity and is widely applied. This technology provides a wafer level manufacturing of the semiconductor devices with high functions and performances while the size of the semiconductor devices is minimized. There are different kinds of operations in the fan in wafer level packaging technology for signal routing numbers of input/output (I/O) within a small area of the semiconductor device, such as fabrication of fine line circuitries, a reduction in the spaces between the lines, piercing of numbers of trenches or vias through several adjacent layers for electrical interconnection, etc.

However, manufacturing of the electrical interconnection structure in such a small and dense area of the semiconductor device is complicated, because it involves numerous of manufacturing operations and those operations are applied on the small semiconductor device including many different kinds of materials with different properties. The difference on materials would increase a complexity of the manufacturing and yield loss of the semiconductor device, such as poor bondability between components, poor reliability of the vias, cracking or delamination of the electrical interconnection structure, etc. As such, there is a continuous need to improve the electrical interconnection structure and the method for manufacturing the electrical interconnection structure and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9C is a schematic view of a first carrier with a metallic member in accordance with some embodiments of the present disclosure.

FIG. 9D is a schematic view of a first carrier with a metallic member within the first carrier in accordance with some embodiments of the present disclosure.

FIG. 9E is a schematic view of a first carrier with a via in accordance with some embodiments of the present disclosure.

FIG. 9F is a schematic view of a first carrier with a via portion in accordance with some embodiments of the present disclosure.

DETAILED DESCRIPTION OF THE INVENTION

Figure 1:
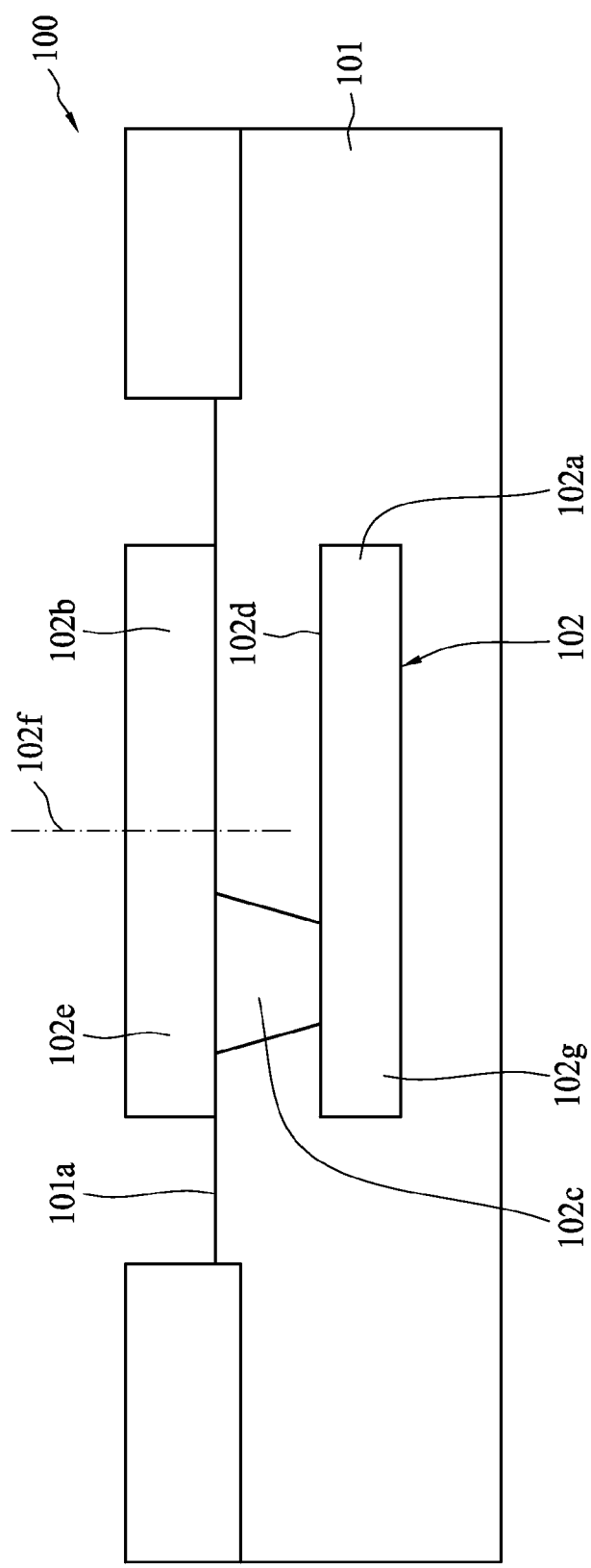
FIG. 1 is a schematic view of a semiconductor device in accordance with some embodiments of the present disclosure.

A semiconductor device is manufactured by a number of operations. During the manufacturing, an electrical interconnection structure is formed between several conductive metallic members across several insulating layers in a printed circuit board (PCB). The conductive metallic members are connected with each other by piercing at least one via from the insulating layer to another insulating layer.

A via-in-pad (VIP) is adopted for forming a via inside the PCB directly beneath a pad disposed on the PCB. The via is formed by etching through at least one of the insulating layers. The via is then coated or filled with a conductive material, so that the conductive metallic members are electrically connected across the insulating layers through the via filled with the conductive material.

The semiconductor device is formed by attaching a pad on a die with the pad on the PCB. However, cracks frequently occur in the via-in-pad design upon connecting a pad on the PCB with a pad of a die by a solder joint. The cracks are found in the solder joint adjacent to the pad on the PCB, as there is high stress near the via on the pad of the PCB. The crack can propagate through the solder joint during subsequent operations to further weaken the solder joint and the electrical connection between the pad of the PCB and the pad of the die, and ultimately result in a failure of the semiconductor device.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved configuration is disclosed. The semiconductor device includes a carrier and a via portion disposed within the carrier and near an end of a pad of the carrier, such that a stress on the pad of the carrier and a solder bump or solder paste for connecting the pad of the carrier with a pad of a die is minimized, or even formation of cracks inside the solder joint is prevented, so as to improve reliability of the semiconductor device.

FIG. 1 is an embodiment of a semiconductor device 100. The semiconductor device 100 includes a carrier 101 and a metallic structure 102 partially disposed within the carrier 101. In some embodiments, the carrier 101 is a printed circuit board (PCB) for supporting several components and connecting the components by a circuitry embedded into the carrier 101.

In some embodiments, the carrier 101 includes several layers extending horizontally across the carrier 101. Each layer includes dielectric material or conductive material. The dielectric material and the conductive material are intervally disposed such that the conductive material in one layer is isolated from another layer by the dielectric material. In some embodiments, the carrier 101 includes various materials such as metals, plastic, glass or etc.

In some embodiments, the metallic structure 102 includes a metallic member 102a, a pad 102b and a via portion 102c. The metallic structure 102 is configured for electrically connecting a circuitry inside the carrier 101 with a circuitry external to the carrier 101 such as a circuitry of a die. In some embodiments, the metallic structure 102 is partially inside the carrier 101 and partially disposed on a surface 101a of the carrier 101. In some embodiments, the metallic structure includes gold, silver, copper, nickel, tungsten, aluminum, palladium and/or alloys thereof.

In some embodiments, the metallic member 102a is disposed inside the carrier 101. The metallic member 102a is surrounded by some layers of the carrier 101. In some embodiments, the metallic member 102a extends horizontally along one of the layers of the carrier 101. In some embodiments, the metallic member 102a extends parallel to the surface 101a of the carrier 101. In some embodiments, a surface 102d of the metallic member 102a is parallel to the surface 101a of the carrier 101. In some embodiments, the metallic member 102a includes gold, silver, copper, nickel, tungsten, aluminum, palladium and/or alloys thereof.

In some embodiments, the pad 102b is disposed on the surface 101a of the carrier 101. The pad 102b is disposed external to the carrier 101. In some embodiments, the pad 102b extends horizontally along the surface 101a of the carrier parallel to the surface 102d of the carrier 101. In some embodiments, the pad 102b is configured for receiving a solder bump, a solder ball, or solder paste. The pad 102b bonds with the solder bump so that the solder bump is configured for attaching on a pad of another carrier such as a die. In some embodiments, the pad 102b includes gold, silver, copper, nickel, tungsten, aluminum, palladium and/or alloys thereof.

In some embodiments, the via portion 102c is disposed within the carrier 101 between the metallic member 102a and the pad 102b. The via portion 102c extends from the surface 101a of the carrier 101 to the surface 102d of the metallic member 102a, so as to electrically connect the metallic member 102a with the pad 102b. The via portion 102c passes through at least one layer of the carrier 101 in order to electrically connect the metallic member 102a inside the carrier 101 with the circuitry external to the carrier 101. In some embodiments, the via portion 102c includes gold, silver, copper, nickel, tungsten, aluminum, palladium and/or alloys thereof.

In some embodiments, the via portion 102c is disposed proximal to an end 102e of the pad 102b. In some embodiments, the via portion 102c is offset from a central axis 102f passing through a center of the pad 102b. The via portion 102c is disposed away from the center of the pad 102b and near the end 102e of the pad 102b. In some embodiments, the via portion 102c is disposed proximal to an end 102g of the metallic member 102a. In some embodiments, the via portion 102c couples the end 102e of the pad 102b with the end 102g of the metallic member 102a.

Figure 2A:
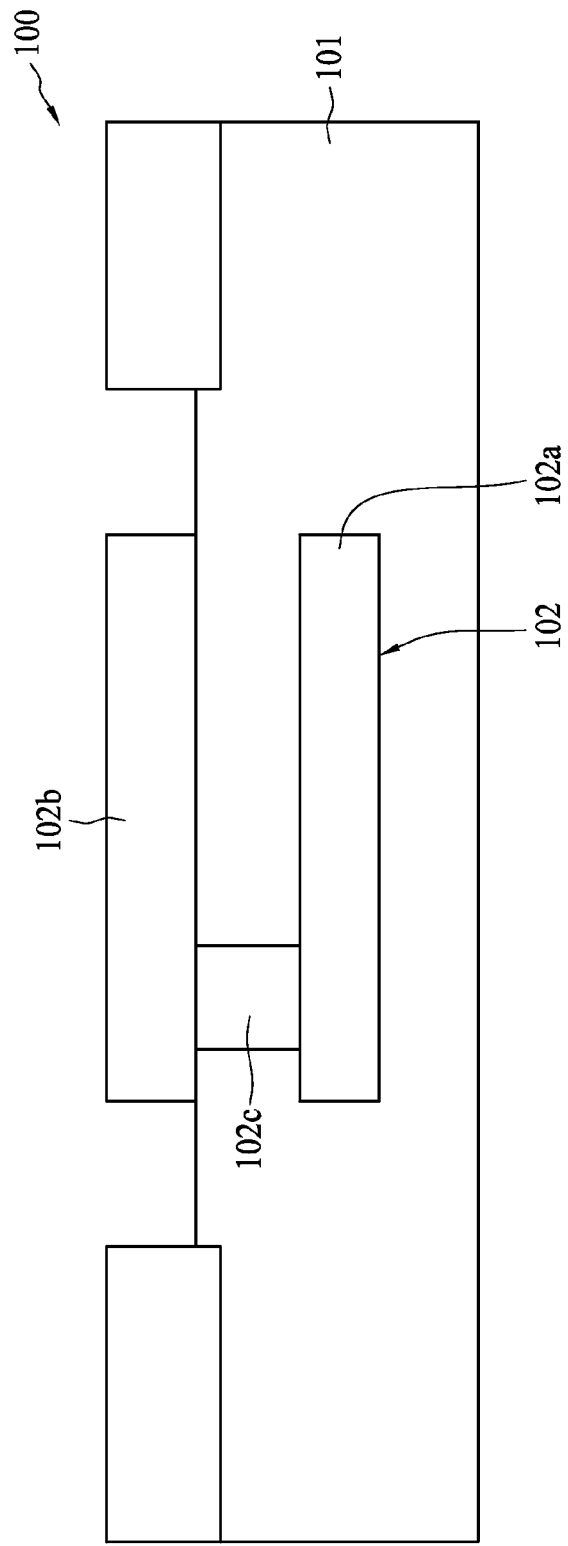
FIG. 2A is a schematic view of a semiconductor device with a cylindrical via portion in accordance with some embodiments of the present disclosure.

In some embodiments, the via portion 102c is in tapered configuration as in FIG. 1. The via portion 102c is tapered between the metallic member 102a and the pad 102b. The via portion 102c extends with an angle so that a width of an end of the via portion 102c is narrower than a width of another opposite end of the via portion 102c. In some embodiments, the via portion 102c is in a cylindrical configuration as in FIG. 2A. In some embodiments, the via portion 102c is in a circular cylindrical shape that the widths of both ends of the via portion 102c are substantially the same.

Figure 2B:
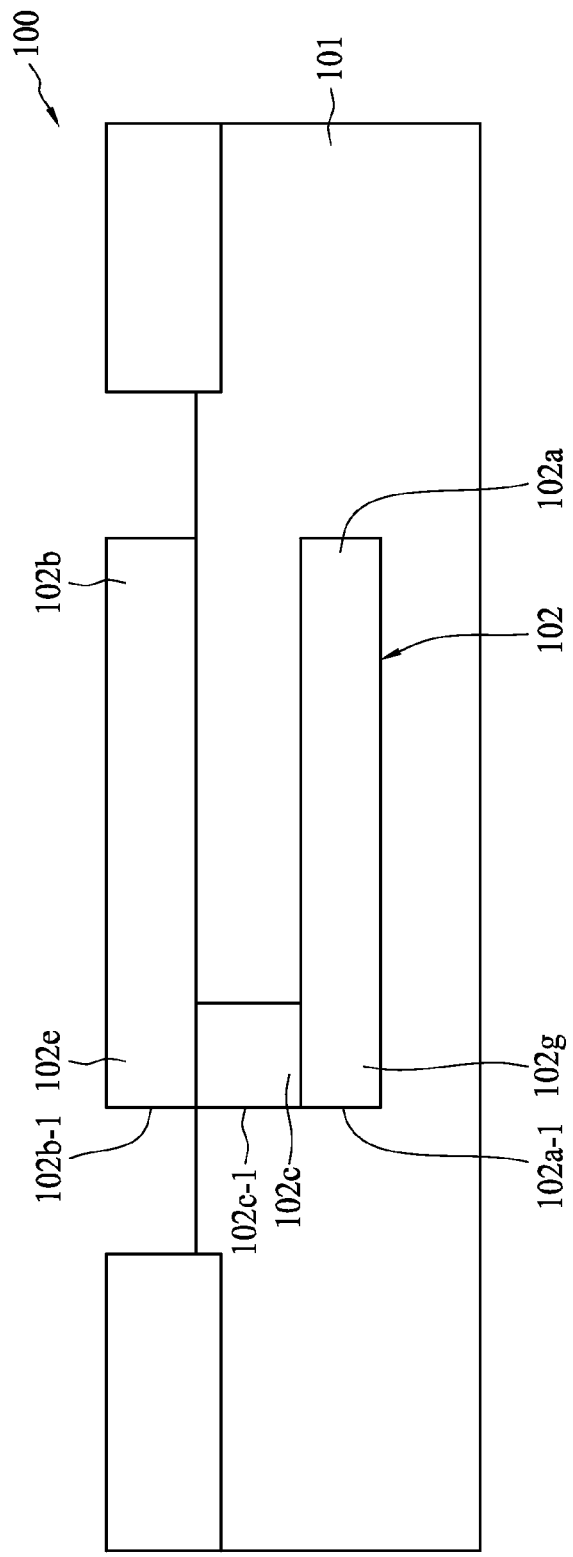
FIG. 2B is a schematic view of a semiconductor device with a sidewall adjacent to an end of a pad and a metallic member in accordance with some embodiments of the present disclosure.

In some embodiments as in FIG. 2B, the via portion 102c is disposed at the end 102e of the pad 102b and the end 102g of the metallic member 102a. A part of a peripheral surface 102b-1 of the pad 102b and a part of a peripheral surface 102a-1 of the metallic member 102a are aligned with a part of a peripheral surface 102c-1 of the via portion 102.

In some embodiments, the part of the peripheral surface 102b-1 of the pad 102b, the part of the peripheral surface 102a-1 of the metallic member 102a and the part of the peripheral surface 102c-1 of the via portion 102 forms a sidewall. The sidewall extends from the end 102e of the pad 102b to the end 102g of the metallic member 102a. In some embodiments, the metallic member 102a, the pad 102b and the via portion 102c are integrally formed such that the metallic structure 102 is in a C-shape.

Figure 2C:
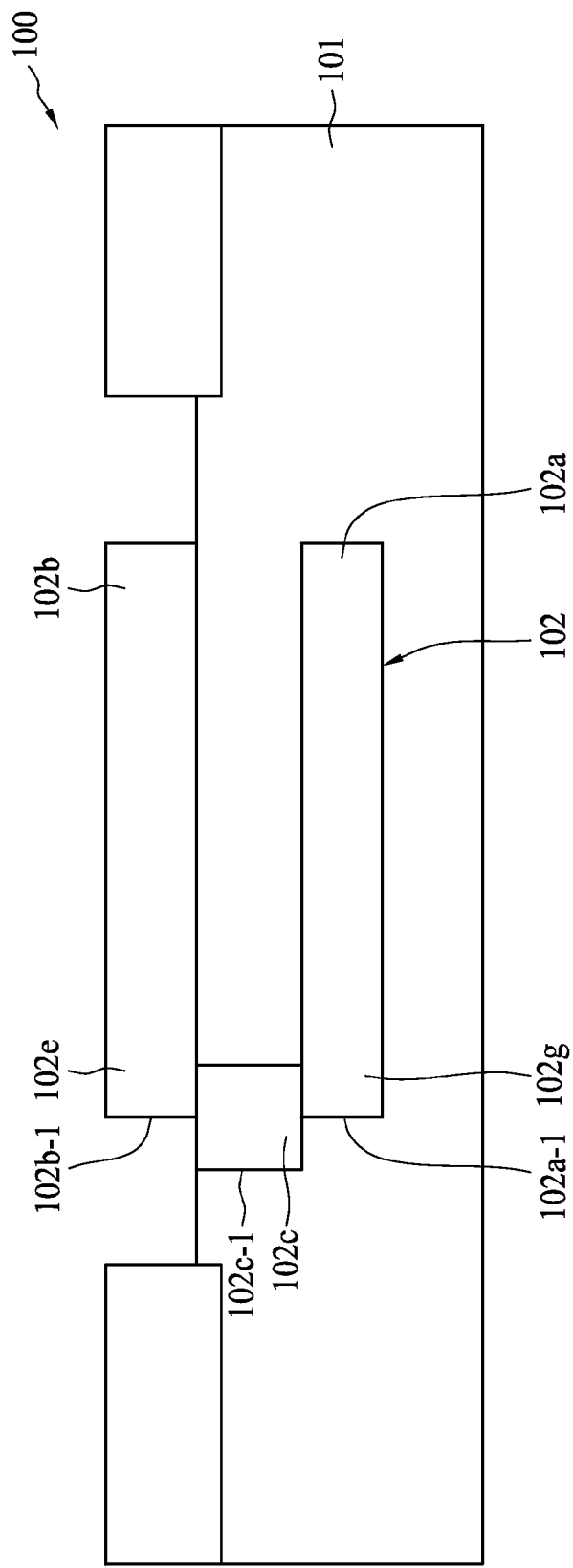
FIG. 2C is a schematic view of a semiconductor device with a protruded via portion in accordance with some embodiments of the present disclosure.

In some embodiments as in FIG. 2C, the via portion 102c is disposed proximal to the end 102e of the pad 102b, and a part of the via portion 102c is protruded from the end 102e of the pad 102 and the end 102g of the metallic member 102a. The protruded part of the via portion 102c is not bounded by the pad 102b and the metallic member 102a. The part of the peripheral surface 102c-1 of the via portion 102c is not aligned with the part of the peripheral surface 102b-1 of the pad 102b and the part of the peripheral surface 102a-1 of the metallic member 102a.

In some embodiments, a top cross section of the via portion 102c is in various shapes. In some embodiments as in FIG. 3A, an interface between the via portion 102c and the pad 102b is in a circular shape. The via portion 102c has a circular cross section from its top view. In some embodiments in FIG. 3B, the interface between the via portion 102c and the pad 102b is in an elliptical shape. The via portion 102c has an elliptical cross section from its top view. In some embodiments in FIG. 3C, the interface between the via portion 102c and the pad 102b is in a quadrilateral shape. The via portion 102c has a quadrilateral cross section from its top view.

Figure 3C:
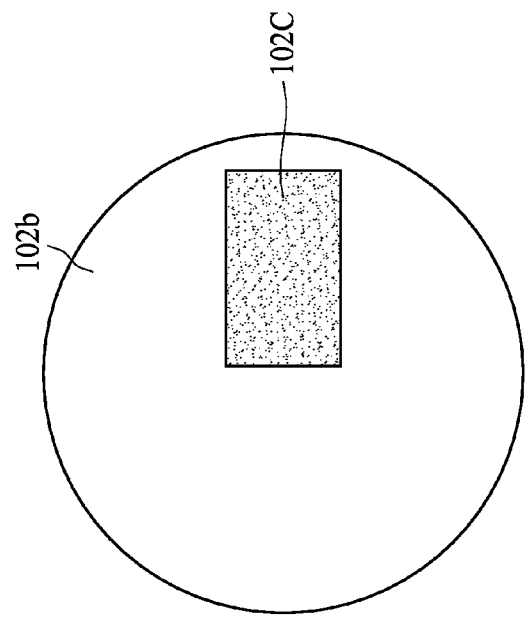
FIG. 3C is a schematic view of a pad and a via portion in quadrilateral shape in accordance with some embodiments of the present disclosure.
Figure 3B:
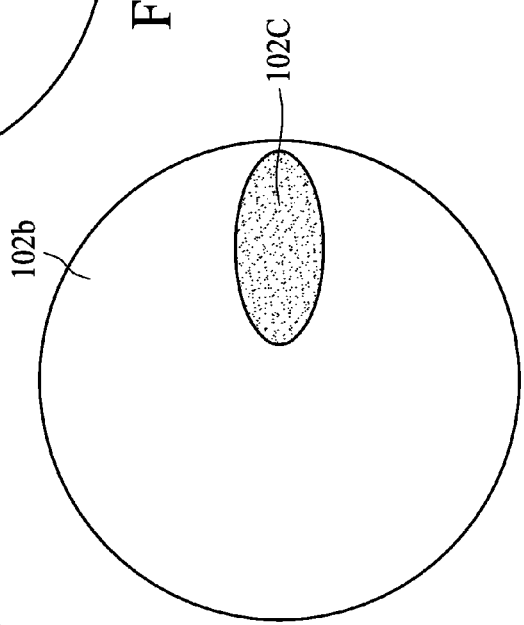
FIG. 3B is a schematic view of a pad and a via portion in elliptical shape in accordance with some embodiments of the present disclosure.
Figure 3A:
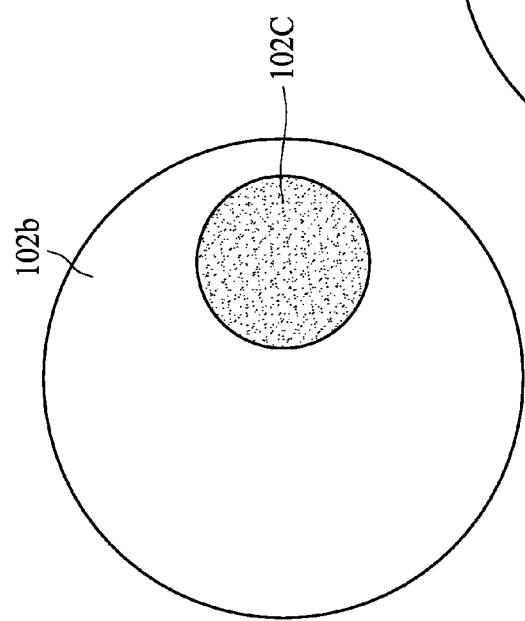
FIG. 3A is a schematic view of a pad and a via portion in circular shape in accordance with some embodiments of the present disclosure.

In some embodiments as in FIGS. 3A, 3B and 3C, the via portion 102c and the pad 102b are in a via-in-pad (VIP) configuration that the top cross section of the via portion 102c is within a cross section of the pad 102b from its top view.

Figure 4:
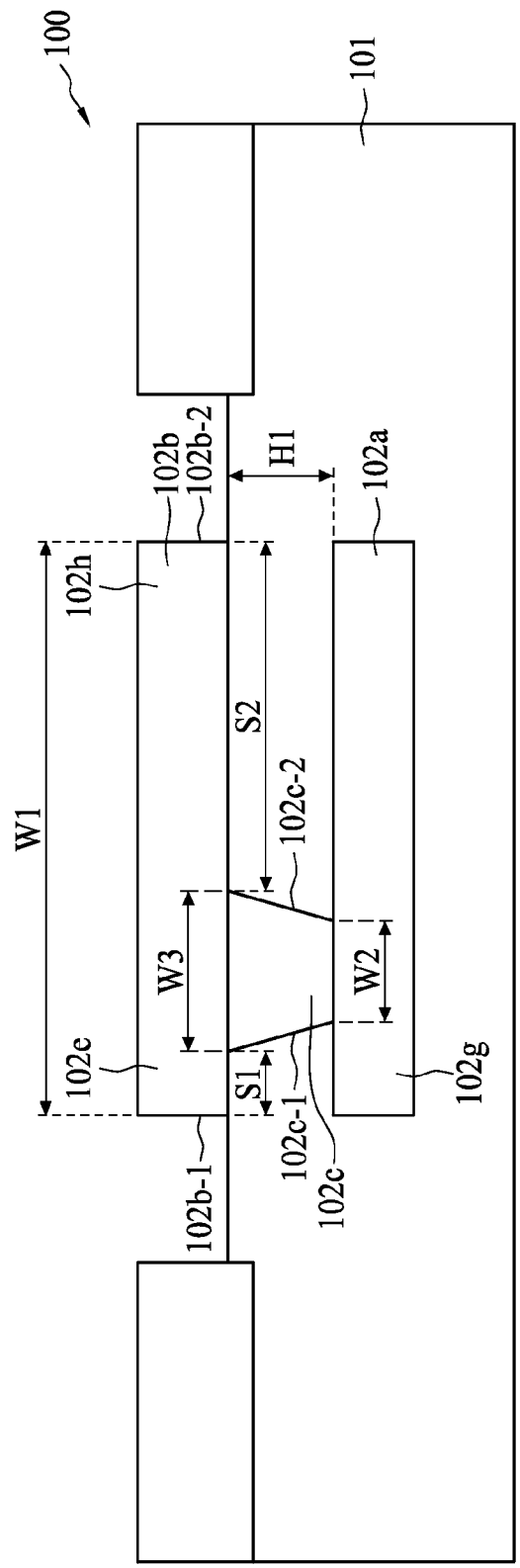
FIG. 4 is a schematic view of a semiconductor device in accordance with some embodiments of the present disclosure.

In some embodiments as in FIG. 4, the via portion 102c is disposed in a distance S1 from a proximal end 102e of the pad 102b. The distance S1 is a shortest distance between the peripheral surface 102b-1 of the pad 102b and the peripheral surface 102c-1 of the via portion 102c. In some embodiments, the via portion 102c is disposed in a distance S2 from a distal end 102h of the pad 102b. The distance S2 is a shortest distance between a peripheral surface 102b-2 of the pad 102b opposite to the peripheral surface 102b-1 and a peripheral surface 102c-2 opposite to the peripheral surface 102c-1.

In some embodiments, a difference of the shortest distance S1 from the via portion 102c to the proximal end 102e of the pad 102b and the shortest distance S2 from the via portion 102c to the distal end 102h of the pad 102b is in a ratio to a width W1 of the pad 102b. In some embodiments, the difference of the shortest distance S1 and the shortest distance S2 is greater than one third of the width W1 of the pad 102b.

In some embodiments, the via portion 102c has a height H1 between the pad 102b and the metallic member 102a. In some embodiments, the height H1 is about 10 um to about 30 um. In some embodiments, the height H1 is about 5 um to about 40 um.

In some embodiments, the width W1 of the pad 102b is a diameter of the pad 102b. In some embodiments, an interface between the metallic member 102a and the via portion 102c has a width W2. In some embodiments, the width W2 is a diameter of an end surface of the via portion 102c adjacent to the metallic member 102a. In some embodiments, an interface between the pad 102b and the via portion 102c has a width W3. In some embodiments, the width W3 is a diameter of an end surface of the via portion 102c adjacent to the pad 102b.

In some embodiments, the width W2 is about 20 um to about 30 um. In some embodiments, the width W2 is about 10 um to about 35 um. In some embodiments, the width W2 is smaller than the width W3. In some embodiments, the width W2 and the width W3 of the via portion 102c are in a ratio. In some embodiments, the ratio of the width W2 and the width W3 is about 1:1.5 to about 1:2. In some embodiments, the ratio of the width W2 and the width W3 is about 1:1.2 to about 1:3.

In some embodiments, the width W2 is greater than the width W3. In some embodiments, the ratio of the width W2 and the width W3 is about 2:1 to about 1.5:1. In some embodiments, the ratio of the width W2 and the width W3 is about 3:1 to about 1.3:1.

Figure 5:
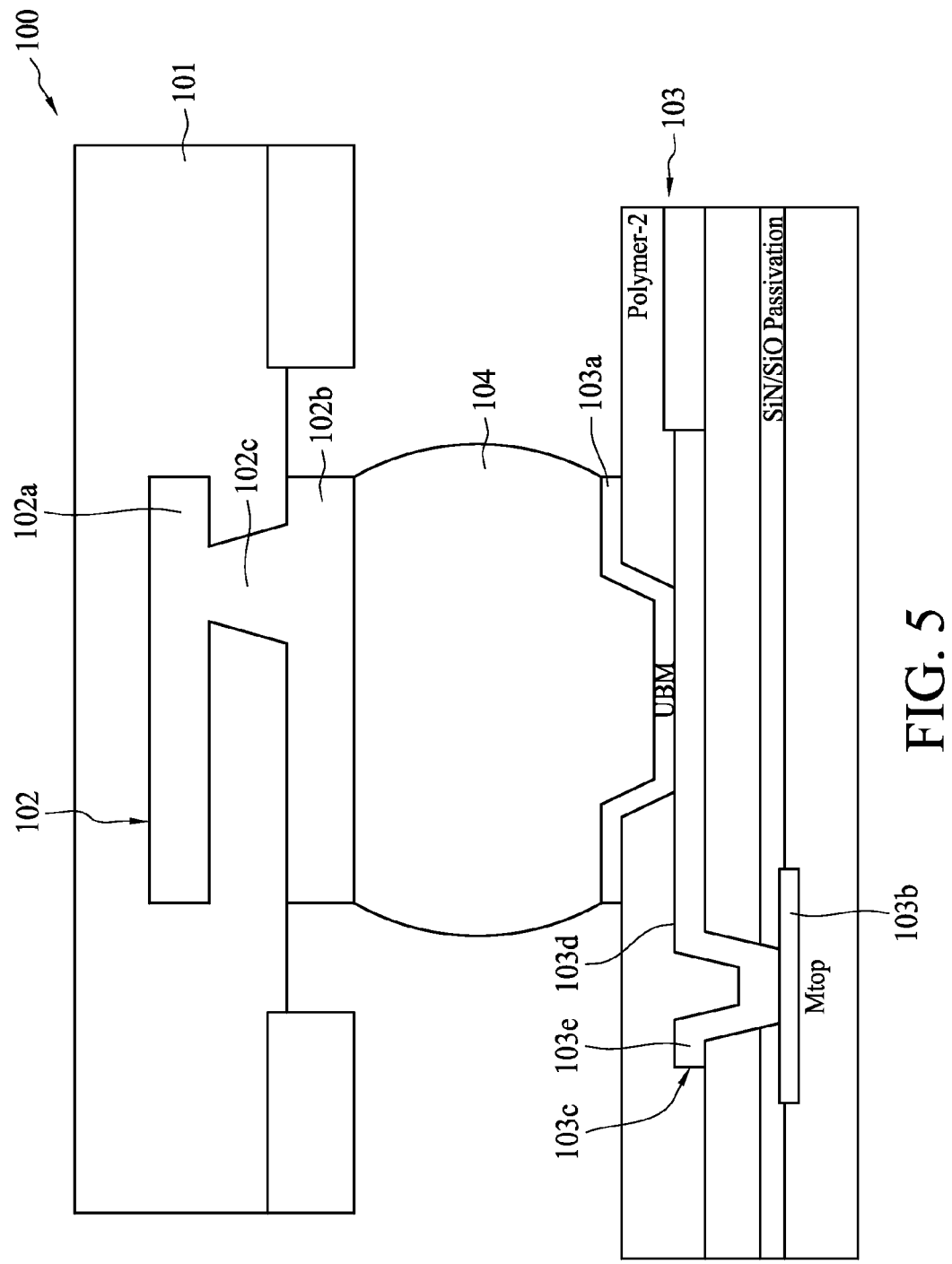
FIG. 5 is a schematic view of a semiconductor device including a first carrier and a second carrier in accordance with some embodiments of the present disclosure.

FIG. 5 is an embodiment of a semiconductor device 100. The semiconductor device 100 includes a first carrier 101 and a second carrier 103. In some embodiments, the first carrier 101 includes a metallic structure 102. The metallic structure 102 includes a metallic member 102a, a pad 102b and a via portion 102c electrically connecting the metallic member 102a and the pad 102b. In some embodiments, the pad 102b is configured for receiving a solder bump 104 of the second carrier 103.

In some embodiments, the second carrier 103 is a die including a circuitry within the die. In some embodiments, the second carrier 103 includes a UBM pad 103a disposed on a surface of the second carrier 103. In some embodiments, the UBM pad 103a is configured for receiving the solder bump 104.

In some embodiments, the UBM pad 103a is disposed on an elongated surface 103d of a redistribution layer (RDL) 103c. In some embodiments, the RDL 103c has a recessed portion 103e adjacent to an end of the elongated surface 103d. The recessed portion 103e passes through at least one layer of the second carrier 103 and connects the UBM pad 103a on the elongated surface 103d with a top metal 103b within the second carrier 103.

In some embodiments, the first carrier 101 is attached with the second carrier 103 through the solder bump 104. The solder bump 104 is disposed between the pad 102b and the UBM pad 103a. When the first carrier 101 is attached with the second carrier 103, the metallic structure 102 of the first carrier 101 is electrically connected with the top metal 103b through the RDL 103c, the UBM pad 103a and the solder bump 104. As such, the circuitry of the first carrier 101 connects with the circuitry of the second carrier 103. In some embodiments, an interface between the via portion 102c and the solder bump 104 is in a circular or an elliptical shape.

Figure 6A:
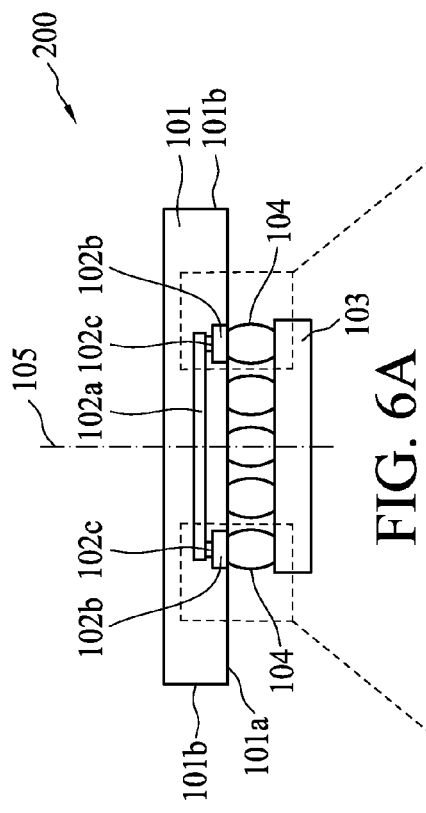
FIG. 6A is a schematic view of a semiconductor package in accordance with some embodiments of the present disclosure.

FIG. 6A is an embodiment of a semiconductor package 200. The semiconductor package 200 includes a first carrier 101 and a second carrier 103. The first carrier 101 is attached on the second carrier 103. In some embodiments, the semiconductor package 200 is configured symmetrically about a central axis 105.

In some embodiments, the first carrier 101 includes several first pads 102b on a surface 101a of the first carrier 101. In some embodiments, the first carrier 101 includes several via portions 102c within the first carrier 101. In some embodiments, the first pad 102b adjacent to an edge 101b of the first carrier 101 includes a via portion 102c. The via portion 102c is extended from the first pad 102b.

Figure 6C:
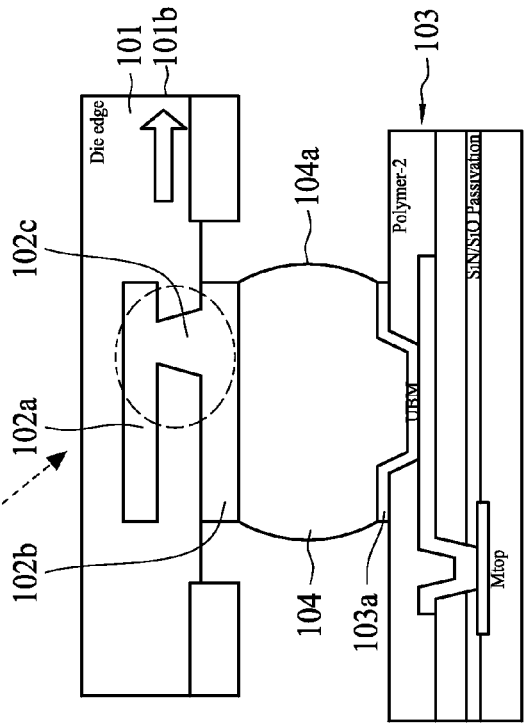
FIG. 6C is an enlarged view of a part of a semiconductor package in accordance with some embodiments of the present disclosure.
Figure 6B:
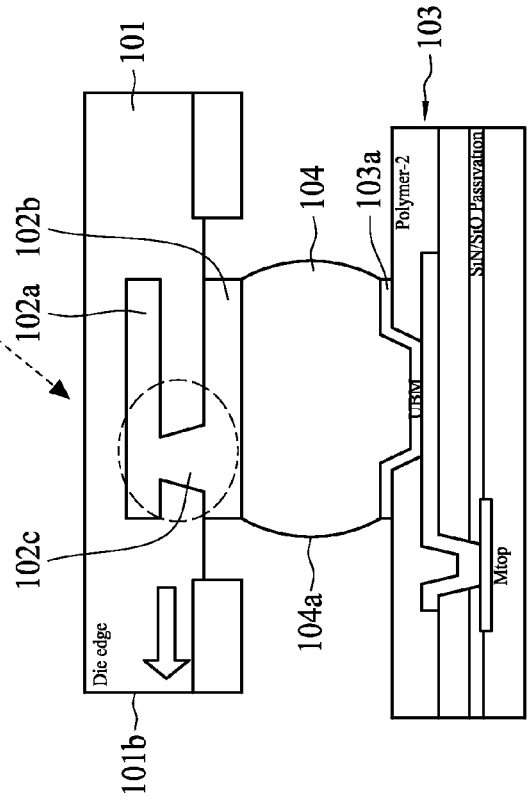
FIG. 6B is an enlarged view of a part of a semiconductor package in accordance with some embodiments of the present disclosure.

In some embodiments, the via portion 102c is configured proximal to an end of the respective first pad 102b as shown in enlarged views of FIG. 6B and FIG. 6C. In some embodiments, the second carrier 103 includes several second pads 103a. Each second pad 103 is electrically connected with one of the first pads 102b through one of the solder bumps 104.

In some embodiments, at least one of the first pads 102b has the via portion 102c proximal to an outermost surface 104a of the respective solder bump 104. In some embodiments, the via portion 102c is disposed adjacent to the edge 101b of the first carrier 101 away from the central axis 105 (refers to FIG. 6A) of the semiconductor package 200.

In some embodiments as in FIG. 6B, the via portion 102c is disposed proximal to a left side of the semiconductor package 200 so that the via portion 102c is proximal to the edge 101b away from the central axis 105 (refers to FIG. 6A). In some embodiments as in FIG. 6C, the via portion 102c is disposed proximal to a right side of the semiconductor package 200 so that the via portion 102c is proximal to the edge 101b away from the central axis 105 (refers to FIG. 6A).

Figure 7:
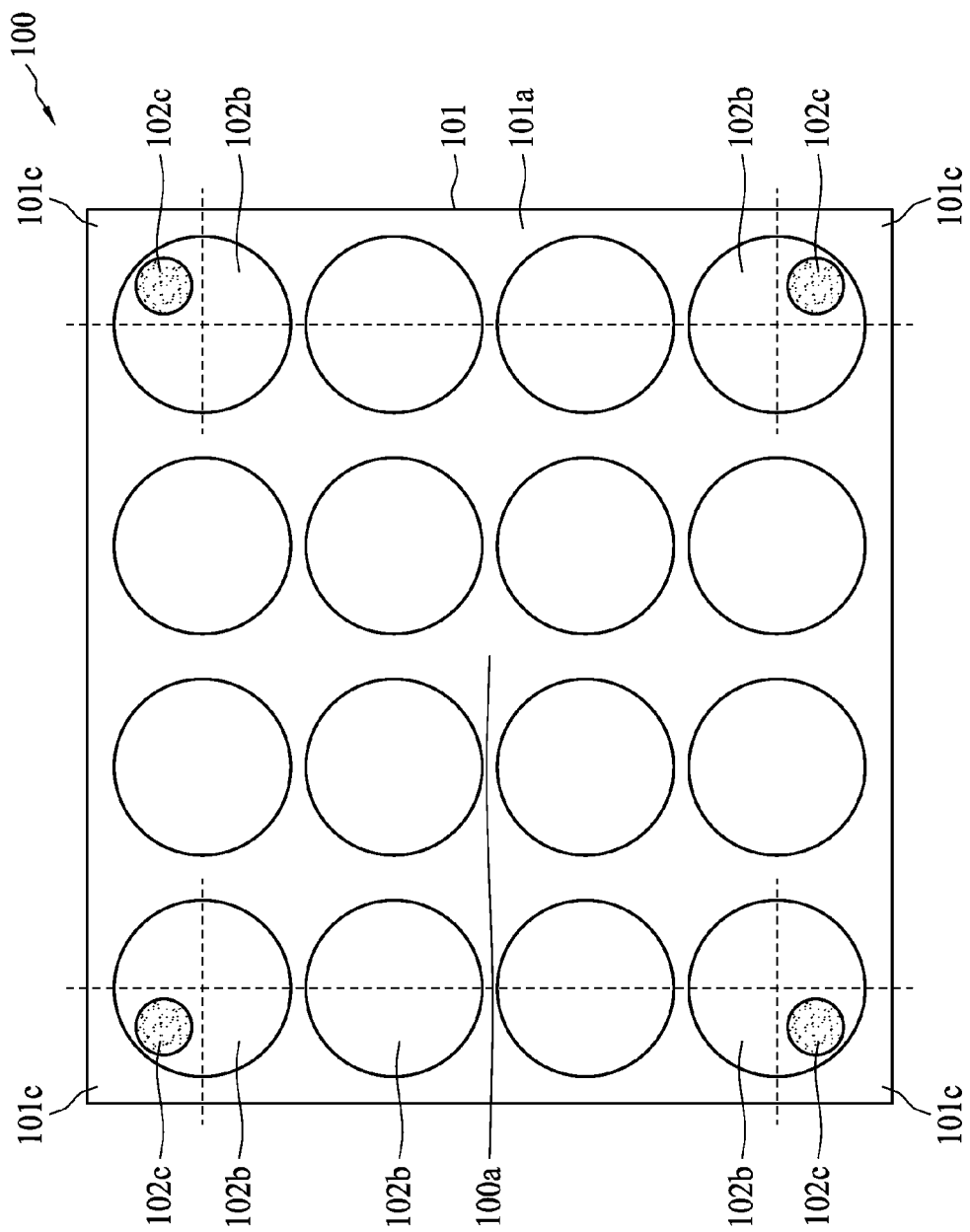
FIG. 7 is a schematic view of a semiconductor device with four via portions in accordance with some embodiments of the present disclosure.

FIG. 7 is an embodiment of a semiconductor device 100 from a top view. The semiconductor device 100 includes a carrier 101. There are several pads 102b disposed on a surface 101a of the carrier 101. In some embodiments, the pads 102b are arranged in an array. The pads 102b are aligned in rows and columns with each other on the surface 101a of the carrier 101. In some embodiments, each pad 102b is spaced in a substantially same distance with each other.

In some embodiments, the pad 102b adjacent to a corner 101c of the carrier 101 includes a via portion 102c disposed on the pad 102b. The via portion 102c is extended from the pad 102b and penetrates into the carrier 101. In some embodiments, the via portion 102c is disposed radially away from a center of the carrier 101.

In some embodiments, the pads 102b disposed at four corners of the carrier 101 respectively have the via portion 102c radially offsetting away from a center 100a of the carrier 101. The via portion 102c is disposed on the respective pad 102b at a position where is the most further away from the center 100a. For example, the pad 102b at a bottom right corner of the carrier 101 has the via portion 102c disposed at a bottom right region of the pad 102b.

Figure 8:
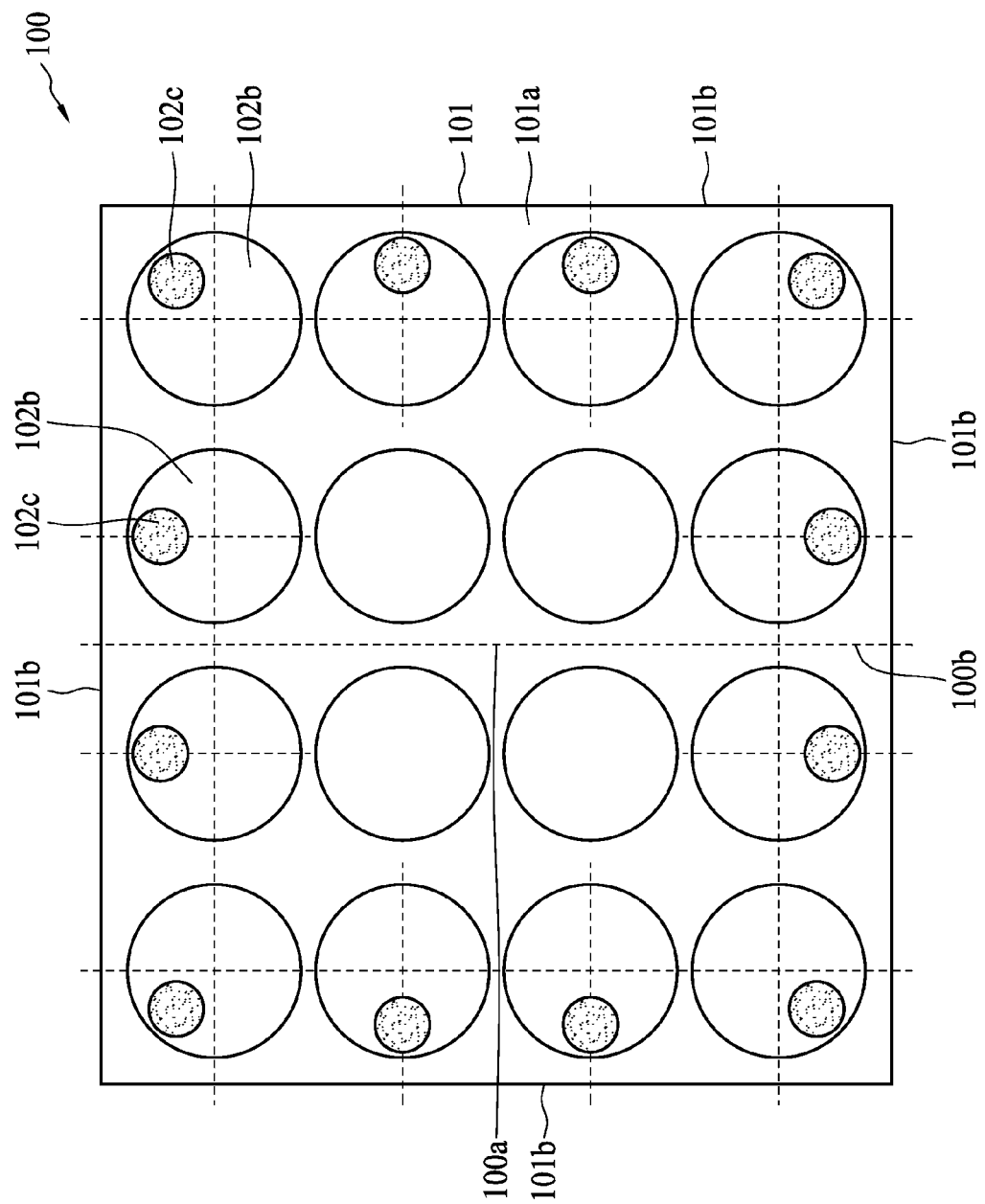
FIG. 8 is a schematic view of a semiconductor device with several via portions near an edge of the semiconductor device in accordance with some embodiments of the present disclosure.

In some embodiments, at least one of the pads 102b disposed at an edge 101b of the carrier 101 has the via portion 102c disposed radially away from the center 100a of the carrier 101. As in FIG. 8, the pads 102b adjacent to the edge 101b respectively have the via portions 102c. The via portions 102c are respectively disposed further away from the center 100a and close to the edge 101b. In some embodiments, the pads 102b and the via portions 102c are arranged symmetrically about a central axis 100b of the carrier 101 passing through the center 100a of the carrier 101.

In the present disclosure, a method of manufacturing a semiconductor device is also disclosed. In some embodiments, a semiconductor device is formed by a method 200. The method 200 includes a number of operations and the description and illustration are not deemed as a limitation as the sequence of the operations.

Figure 9:
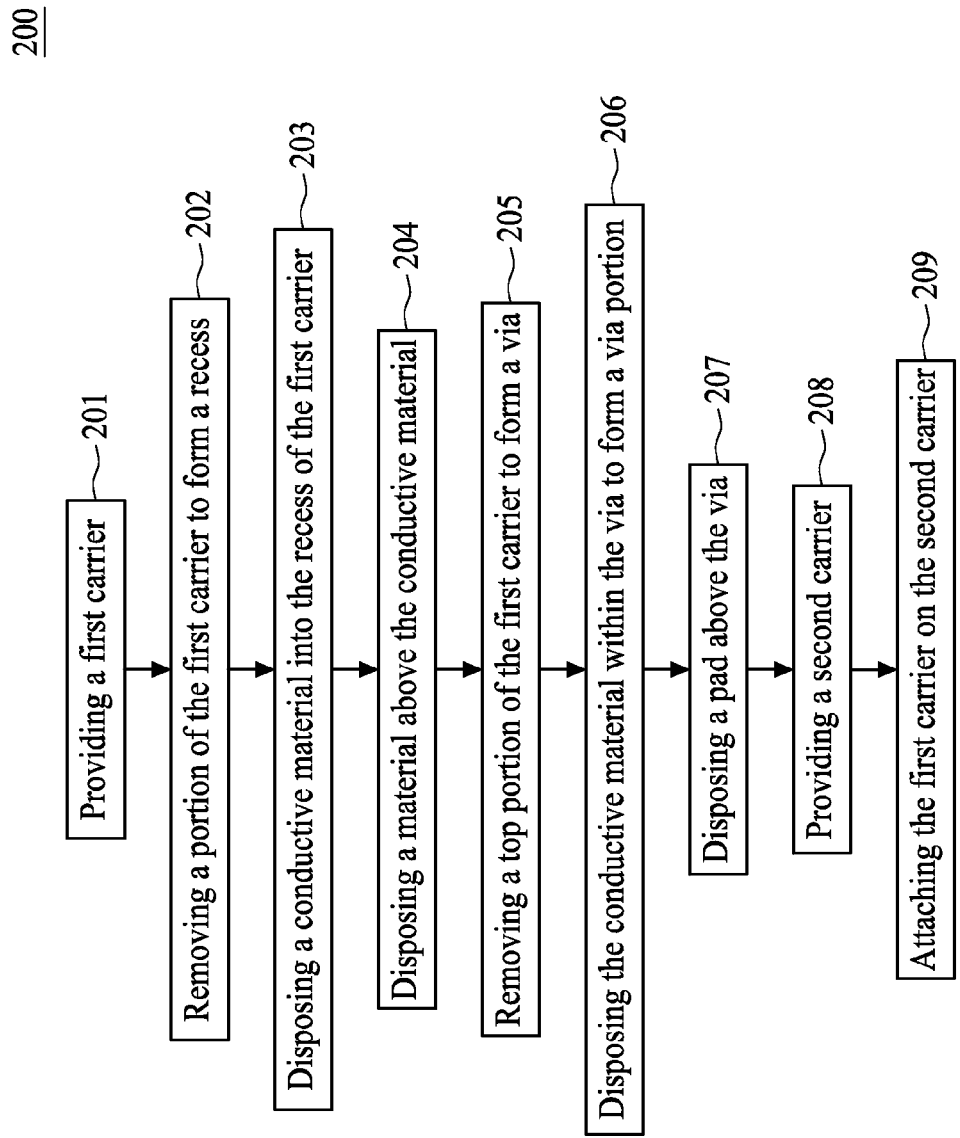
FIG. 9 is a flow diagram of a method of manufacturing a semiconductor device in accordance with some embodiments of the present disclosure.

FIG. 9 is an embodiment of a method 200 of manufacturing a semiconductor device. The method 200 includes a number of operations (201, 202, 203, 204, 205, 206, 207, 208, 209).

Figure 9A:
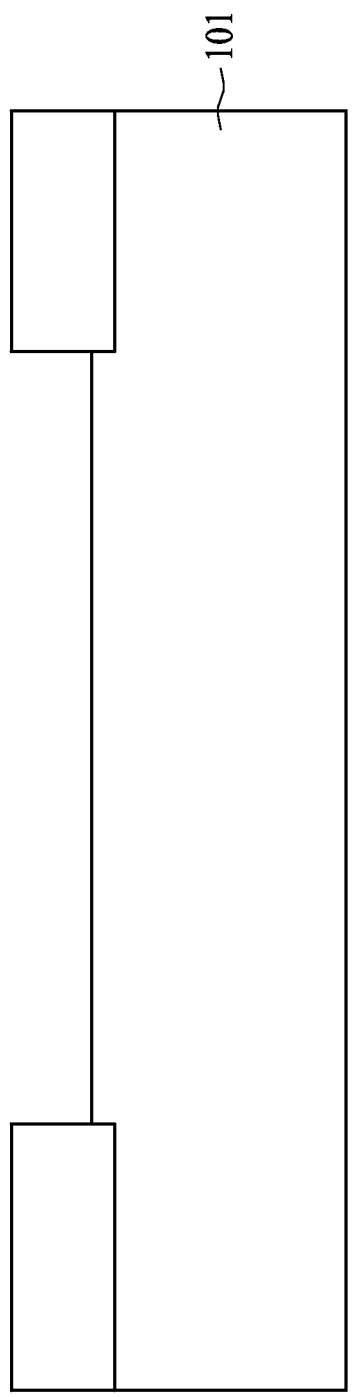
FIG. 9A is a schematic view of a first carrier in accordance with some embodiments of the present disclosure.

In operation 201, a first carrier 101 is provided as in FIG. 9A. In some embodiments, the first carrier 101 is a PCB including a circuitry within the PCB. The first carrier 101 is configured for receiving another carrier and electrically connecting with another carrier including at least one die.

Figure 9B:
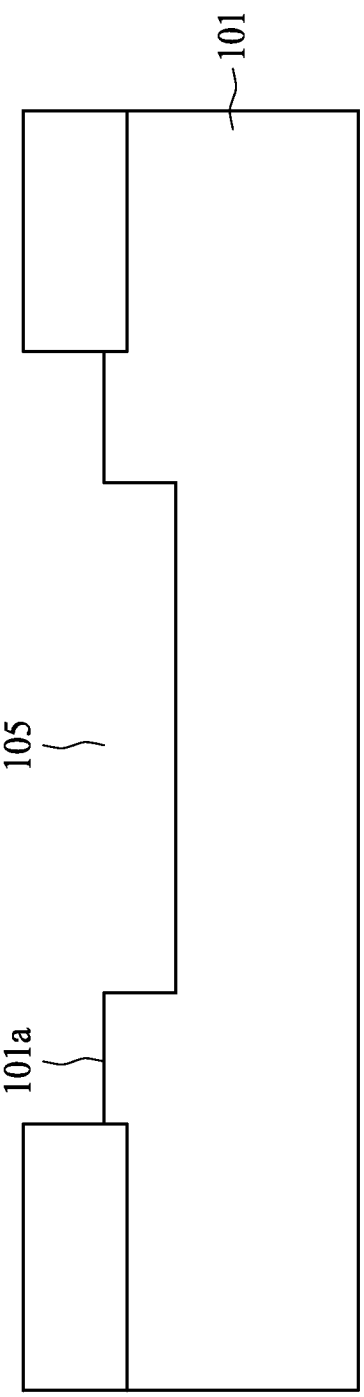
FIG. 9B is a schematic view of a first carrier with a recess in accordance with some embodiments of the present disclosure.

In operation 202, a portion of the first carrier 101 is removed as in FIG. 9B. In some embodiments, the top part of the first carrier 101 is etched away towards a bottom of the first carrier 101 to form a recess 107. The recess 107 is extended parallel to a surface 101a of the first carrier 101. In some embodiments, the portion of the first carrier 101 is removed by etching, photolithography or etc.

In operation 203, a conductive material 106 is disposed into the recess 107 of the first carrier 101 as in FIG. 9C. In some embodiments, the conductive material 106 fills the recess 107, such that a top surface 106a of the conductive material 106 is at a substantially same level as the surface 101a of the first carrier 101.

In some embodiments, the conductive material 106 is disposed by electroplating or sputtering or etc. In some embodiments, the conductive material 106 is a metallic member 102a with reference to FIG. 1. In some embodiments, the metallic member 102a includes gold, silver, copper, nickel, tungsten, aluminum, palladium and/or alloys thereof.

In operation 204, a material is disposed above the conductive material 106 as in FIG. 9D. In some embodiments, the material is disposed to cover the conductive material 106 and become a top of the first carrier 101. In some embodiments, the material includes dielectric materials such as spin-on glass (SOG), silicon oxide, silicon oxynitride, silicon nitride or the like. The conductive material 106 is then disposed within the first carrier 101.

In operation 205, a top portion of the first carrier 101 is removed to form a via 102j as in FIG. 9E. In some embodiments, the via 102j is extended vertically from the top of the first carrier 101 to the metallic member 102a. In some embodiments, the via 102j is disposed adjacent to an end 102g of the metallic member 102a. In some embodiments, the via 102j is tapered towards the metallic member 102a. In some embodiments, the via 102j is removed by etching, photolithography or etc.

In operation 206, a conductive material is disposed into the via 102j to form a via portion 102c as in FIG. 9F. In some embodiments, the conductive material fills the via 102j to form a via portion 102c above the metallic member 102a, so that the via portion 102c is electrically connected with the metallic member 102c. In some embodiments, the conductive material is disposed by electroplating or sputtering or etc. In some embodiments, the via portion includes gold, silver, copper, nickel, tungsten, aluminum, palladium and/or alloys thereof.

Figure 9G:
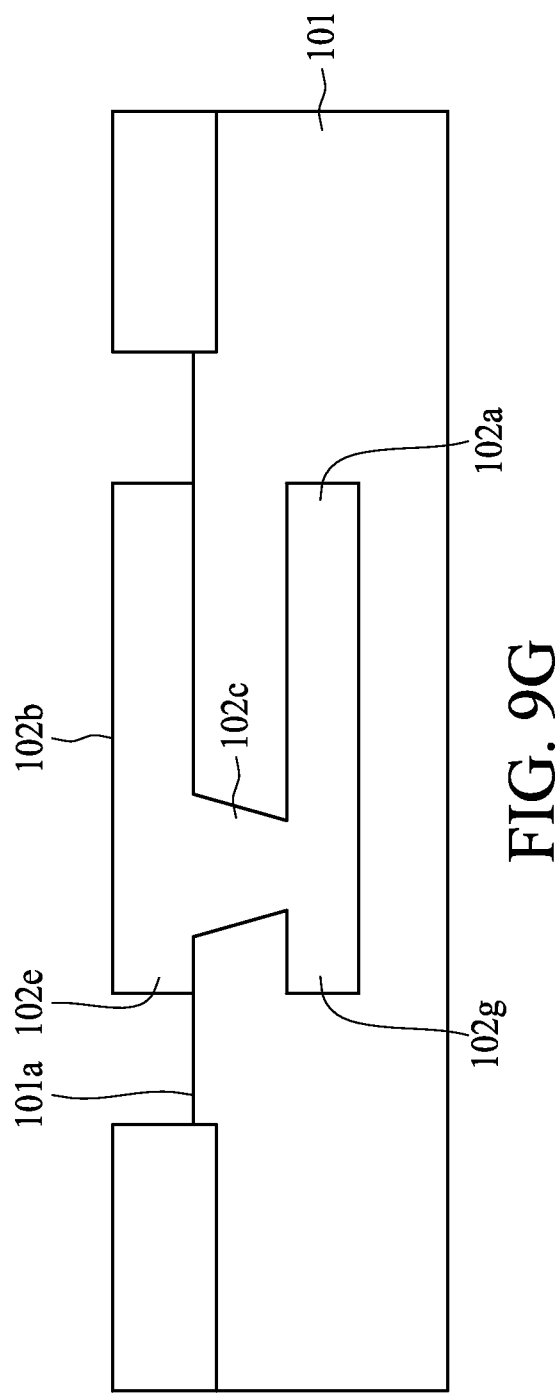
FIG. 9G is a schematic view of a first carrier with a pad in accordance with some embodiments of the present disclosure.

In operation 207, a pad 102b is disposed above the via portion 102c as in FIG. 9G. In some embodiments, the pad 102b is disposed on the surface 101a of the first carrier 101, and is extended parallel to the surface 101a. The pad 102b is electrically connected with the via portion 102c of the first carrier 101.

In some embodiments as in FIG. 9G, the via portion 102c is disposed proximal to an end 102e of the pad 102b. In some embodiments, the pad 102b is electrically connected with the metallic member 102a through the via portion 102c. In some embodiments, the pad 102b is configured for receiving a solder bump to connect the metallic member 102a with a circuitry external to the first carrier 101 through the via portion 102c, the pad 102b and the solder bump. In some embodiments, the pad 102b includes gold, silver, copper, nickel, tungsten, aluminum, palladium and/or alloys thereof.

Figure 9H:
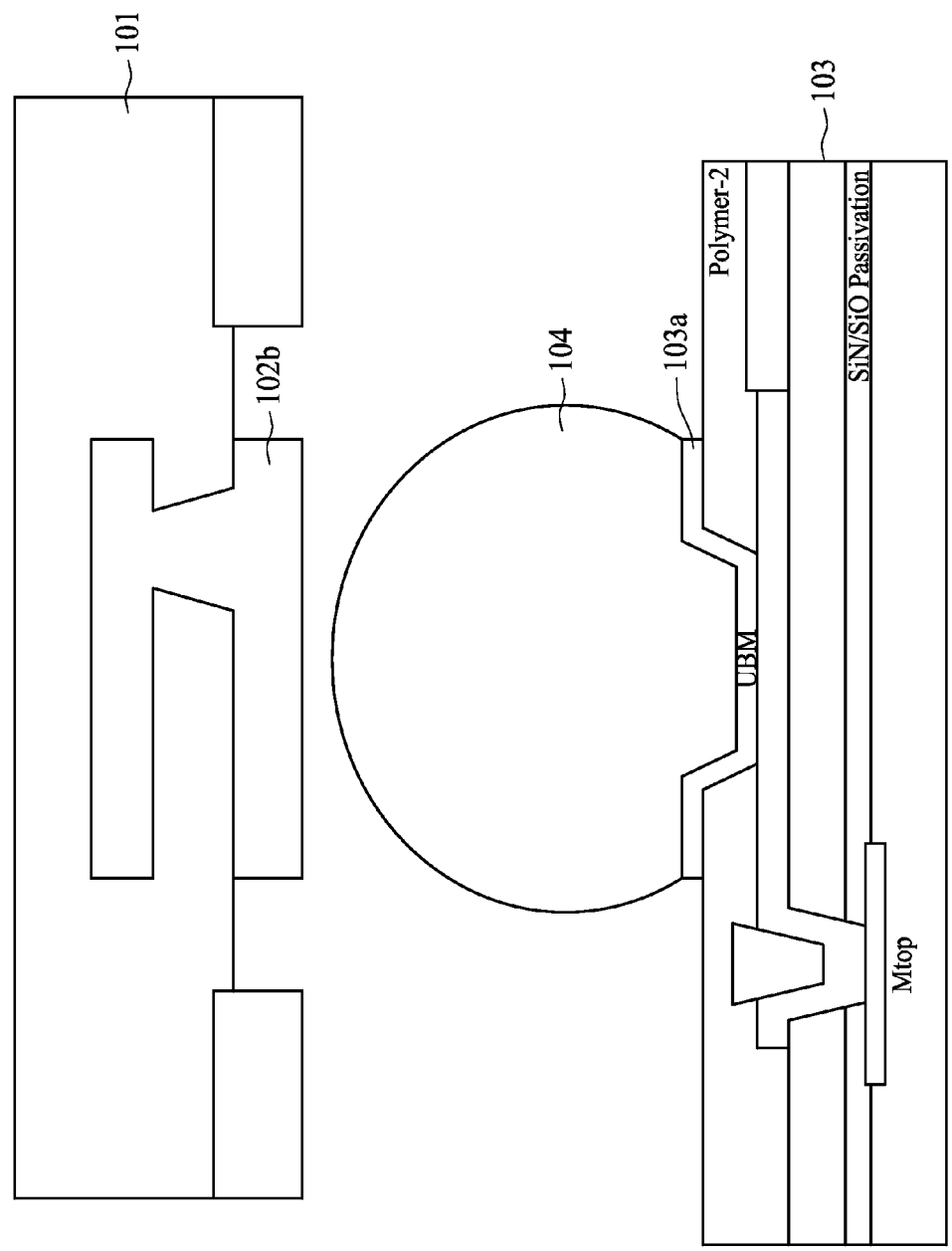
FIG. 9H is a schematic view of a first carrier and a second carrier in accordance with some embodiments of the present disclosure.

In operation 208, a second carrier 103 is provided as in FIG. 9H. In some embodiments, the second carrier 103 is a die including a circuitry within the die. The second carrier 103 includes a UBM pad 103a disposed on a surface of the second carrier 103. The UBM pad 103a is configured for receiving the solder bump 104. In some embodiments, the solder bump 104 is configured for attaching with the pad 102b of the first carrier 101. In some embodiments, the solder bump 104 is a solder ball or a solder paste or etc.

Figure 9I:
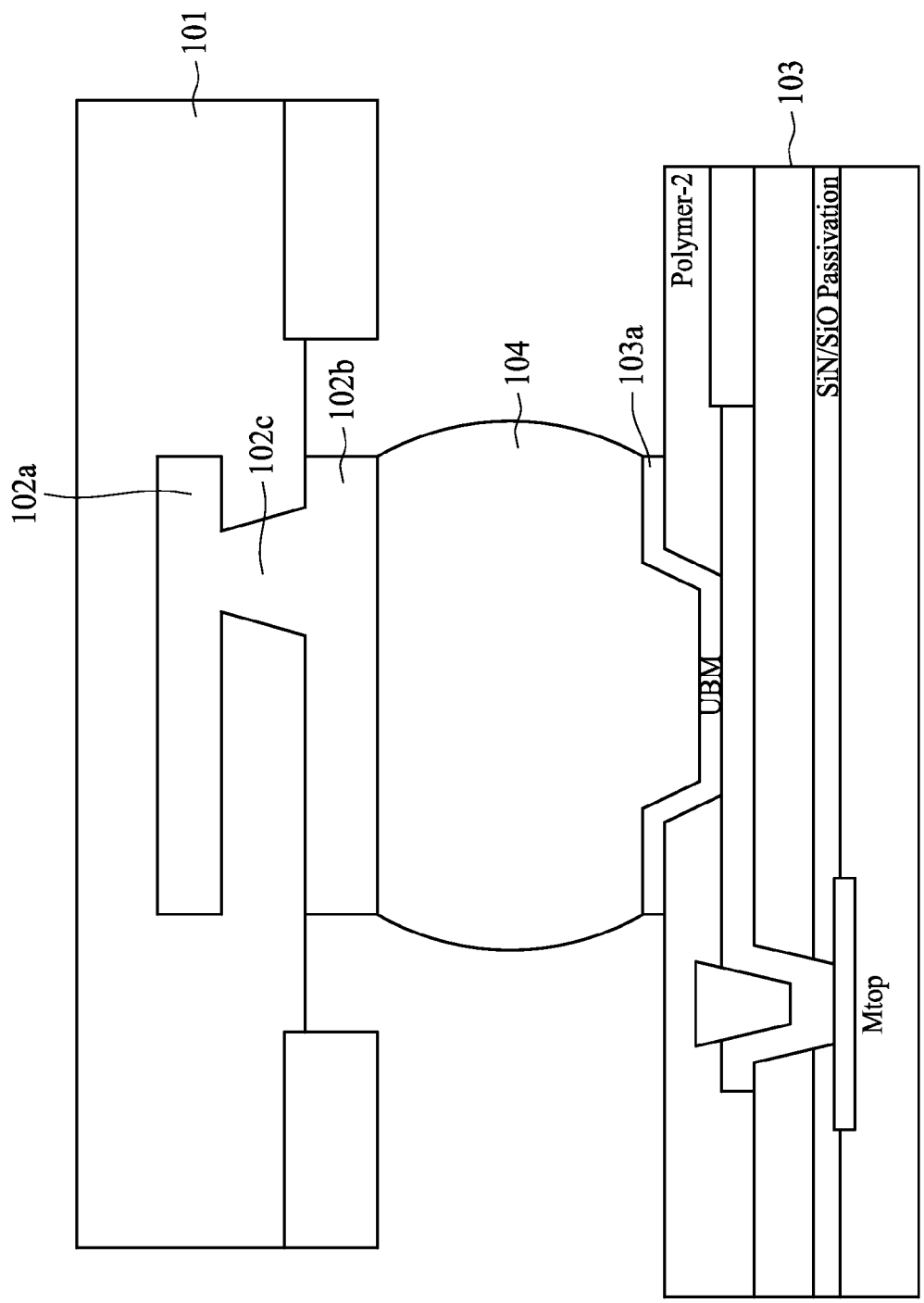
FIG. 9I is a schematic view of a first carrier bonded with a second carrier in accordance with some embodiments of the present disclosure.

In operation 209, the first carrier 101 is attached on the second carrier 103 as in FIG. 9I. In some embodiments, the first carrier 101 is bonded with the second carrier 103 through the solder bump 104. The pad 102b of the first carrier 101 connects with the UBM pad 103a of the second carrier 103 upon attaching the first carrier 101 on the second carrier 103. The circuitry of the second carrier 103 is electrically connected with the metallic member 102a through the UMB pad 103a, the solder bump 104, the pad 102b and the via portion 102c.

In some embodiments, a semiconductor device includes a carrier and a metallic structure including a metallic member, a pad and a via portion, the metallic member is disposed inside the carrier, the pad is configured for receiving a solder bump and is disposed on a surface of the carrier, the via portion is configured for electrically connecting the metallic member and the pad, and the via portion is disposed proximal to an end of the pad.

In some embodiments, the via portion is offset from a central axis passing through a center of the pad. In some embodiments, the via portion is in tapered configuration between the metallic member and the pad. In some embodiments, the carrier is a printed circuit board (PCB). In some embodiments, the via portion couples the end of the pad with an end of the metallic member.

In some embodiments, an interface between the via portion and the pad is in a circular or an elliptical shape. In some embodiments, an interface between the pad and the solder bump is in a circular or an elliptical shape.

In some embodiments, the difference of a first shortest length between the via portion and the end of the pad and a second shortest length between the via portion and another end of the pad is greater than one third of a width of the pad. In some embodiments, a height of the via portion between the metallic member and the pad is about 10 um to about 30 um. In some embodiments, an interface between the metallic member and the via portion has a width of about 20 um to about 30 um.

In some embodiments, a semiconductor package includes a first carrier including a plurality of first pads on a surface of the first carrier and a plurality of via portions within the first carrier respectively extending from the plurality of first pads, and a second carrier including a plurality of second pads respectively electrically connecting with the plurality of first pads by a plurality of solder bumps. At least one of the plurality of the first pads has the via portion disposed proximal to an end of the respective first pad.

In some embodiments, the at least one of the plurality of first pads has a via portion proximal to an outermost surface of the respective solder bump. In some embodiments, the at least one of the plurality of first pads at a corner of the semiconductor package has the via portion disposed radially away from a center of the first carrier.

In some embodiments, the at least one of the plurality of first pads disposed adjacent to an edge of the semiconductor package has the via portion disposed radially away from a center of the first carrier. In some embodiments, four of the plurality of the first pads disposed respectively at four corners of the semiconductor package have respective four via portions radially offsetting away a center of the semiconductor package.

In some embodiments, a method of manufacturing a semiconductor device includes providing a carrier, removing a portion of the carrier for forming a via extending a surface of the carrier to an interior of the carrier, filling the via by a conductive material, disposing the conductive material on the surface of the carrier. The via is disposed proximal to an end portion of the conductive material.

In some embodiments, the method further includes forming a metallic member within the carrier coupling with the via and extending parallel to the surface of the carrier.

In some embodiments, the pad formed on the surface of the carrier is configured for receiving a solder bump. In some embodiments, the via and the pad are in a via-in-pad (VIP) configuration that a top cross-section of the via is within a top cross-section of the pad. In some embodiments, the via is formed by etching.

The methods and features of this invention have been sufficiently described in the above examples and descriptions. It should be understood that any modifications or changes without departing from the spirit of the invention are intended to be covered in the protection scope of the invention.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:
1. A semiconductor device, comprising:
  a first substrate;
  a metallic member disposed within the first substrate and including a first end and a second end opposite to the first end;
  a first pad disposed on the first substrate and including a third end and a fourth end opposite to the third end;

a via portion extending between and coupled with the metallic member and the first pad;

a second substrate disposed opposite to the first substrate;

a second pad disposed on the second substrate and including a fifth end and a sixth end opposite to the fifth end; and a conductive bump disposed between and directly on the first pad and the second pad, wherein the metallic member, the first pad, the second pad and the conductive bump are vertically aligned with each other, and the via portion is disposed distal to the first end of the metallic member and proximal to the second end of the metallic member, and the first end of the metallic member is vertically aligned with the fifth end of the second pad and the second end of the metallic member is vertically aligned with the sixth end of the second pad.

2. The semiconductor device of claim 1, wherein the via portion is offset from a central axis passing through a center of the first pad.

3. The semiconductor device of claim 1, wherein the via portion is in a tapered configuration between the metallic member and the first pad.

4. The semiconductor device of claim 1, wherein the first substrate is a printed circuit board (PCB).

5. The semiconductor device of claim 1, wherein the first end and the second end of the metallic member are vertically aligned with the third end and the fourth end of the first pad respectively.

6. The semiconductor device of claim 1, wherein an interface between the via portion and the first pad is in a circular or an elliptical shape.

7. The semiconductor device of claim 1, wherein an interface between the first pad and the conductive bump is in a circular or an elliptical shape.

8. The semiconductor device of claim 1, wherein the difference of a first shortest length between the via portion and the third end of the first pad and a second shortest length between the via portion and the fourth end of the first pad is greater than one third of a width of the first pad.

9. The semiconductor device of claim 1, wherein a height of the via portion between the metallic member and the first pad is about 10 um to about 30 um.

10. The semiconductor device of claim 1, wherein an interface between the metallic member and the via portion has a width of about 20 um to about 30 um.

11. A semiconductor package, comprising, a printed circuit board (PCB);

a metallic member disposed within the PCB and including a first end and a second and opposite to the first end;

a pad disposed over a surface of the PCB;

a via portion disposed within the PCB and extended between the metallic members and the pad;

a substrate disposed opposite to the PCB;

a UBM pad disposed over the substrate and including a third end and a fourth end opposite to the third end;

a redistribution layer (RDL) disposed within the substrate and including an elongated surface coupled with the UBM pad and a recessed portion coupled with the elongated surface and extended away from the PCB; and a conductive bump disposed between and bonded with the pad and the UBM pad, wherein the metallic member is vertically aligned with the pad, the UBM pad and the conductive bump, and the via portion is disposed distal to the first end of the metallic member and proximal to the second end of the metallic member, and the first end of the metallic member is vertically aligned with the third end of the UBM pad and the second end of the metallic member is vertically aligned with the fourth end of the UBM pad.

12. The semiconductor package of claim 11, wherein the pad has the via portion proximal to an outermost surface of the conductive bump.

13. The semiconductor package of claim 11, wherein the pad at a corner of the semiconductor package has the via portion disposed radially away from a center of the PCB.

14. The semiconductor package of claim 11, wherein the pad disposed adjacent to an edge of the semiconductor package has the via portion disposed radially away from a center of the PCB.

15. The semiconductor package of claim 11, wherein the via portion is tapered from the pad towards the metallic member.

16. A semiconductive device, comprising:

a first substrate;

a metallic member disposed within the first substrate and including a first end and a second end opposite to the first end;

a first pad disposed on the first substrate;

a via portion extended between and coupled with the metallic member and the first pad;

a second substrate disposed opposite to the first substrate;

a second pad disposed on the second substrate and including a third end and a fourth end opposite to the third end; and a conductive bump disposed between and on the first pad and the second pad, wherein the metallic member, the first pad, the second pad and the conductive bump are vertically aligned with each other, and a distance between the via portion and the first end is substantially greater than a distance between the via portion and the second end, and the first end of the metallic member is vertically aligned with the third end of the second pad and the second end of the metallic member is vertically aligned with the fourth end of the second pad.

17. The semiconductor device of claim 1, wherein the via portion extends from the surface of the first substrate to a surface of the metallic member.

18. The semiconductor device of claim 16, wherein a width of an end of the via portion is less than a width of an opposite end of the via portion.

19. The semiconductor device of claim 16, wherein the via portion is disposed away from a center of the first pad.

20. The semiconductor package of claim 11, wherein the pad has the via portion disposed away from a center of the conductive bump.

* * * * *